(12) United States Patent
Jin et al.

(10) Patent No.: US 6,435,942 B1
(45) Date of Patent: Aug. 20, 2002

(54) CHEMICAL MECHANICAL POLISHING PROCESSES AND COMPONENTS

(75) Inventors: Raymond R Jin, San Jose; Jeffrey Drue David, Sunnyvale; Fred C Redeker, Fremont; Thomas H Osterheld, Mountain View, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/502,379

(22) Filed: Feb. 11, 2000

Related U.S. Application Data (60) Provisional application No. 60/119,763, filed on Feb. 11, 1999.

(51) Int. Cl.$^7$ .......................... B24B 49/00; B24B 51/00; B24B 1/00
(52) U.S. Cl. ................ 451/8; 451/37; 451/41; 451/57; 451/59
(58) Field of Search ................... 451/8, 41, 36, 451/57, 37, 59; 216/88, 89, 90

(56) References Cited

U.S. PATENT DOCUMENTS

| | | | |
|---|---|---|---|
| 5,395,801 A | | 3/1995 | Doan et al. |
| 5,514,245 A | * | 5/1996 | Doan et al. ............... 156/636.1 |
| 5,516,346 A | * | 5/1996 | Cadien et al. ................. 51/308 |
| 5,700,383 A | | 12/1997 | Feller et al. |
| 5,913,712 A | * | 6/1999 | Molinar ........................ 451/41 |
| 6,247,998 B1 | * | 6/2001 | Wiswesser et al. ............. 451/6 |

\* cited by examiner

*Primary Examiner*—Timothy V Eley
(74) *Attorney, Agent, or Firm*—Fish & Richardson

(57) ABSTRACT

A substrate is chemical mechanical polished first with a single layer hard polishing pad and a high-selectivity slurry until a first endpoint is reached, and then with a soft polishing pad and a low-selectivity slurry until a second endpoint is reached. Dishing is reduced when low-selectivity slurry is used at the second polishing step. Low Within-Wafer-Non-Uniformity is achieved by using a single layer hard pad at low pressure at the first polishing step.

19 Claims, 12 Drawing Sheets

CHEMICAL MECHANICAL POLISHING PROCESSES AND COMPONENTS

This application claims priority from provisional application Ser. No. 60/119,763, filed Feb. 11, 1999.

BACKGROUND

The present invention relates generally to chemical mechanical polishing of substrates, and more particularly to improvements in chemical mechanical polishing processes and components.

An integrated circuit is typically formed on a substrate by the sequential deposition of conductive, semiconductive or insulative layers on a silicon wafer. One fabrication step involves depositing a filler layer over a patterned stop layer, and planarizing the filler layer until the stop layer is exposed. For example, a conductive filler layer may be deposited on a patterned insulative stop layer to fill the trenches or holes in the stop layer. After planarization, the portions of the conductive layer remaining between the raised pattern of the insulative layer form vias, plugs and lines that provide conductive paths between thin film circuits on the substrate.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a Astandard@ pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished (lacks small-scale roughness) and flat (lacks large-scale topography). The polishing rate, finish and flatness are determined by the pad and slurry combination, the relative speed between the substrate and pad, and the force pressing the substrate against the pad. The polishing rate sets the time needed to polish a layer. Because inadequate flatness and finish can create defective substrates, the selection of a polishing pad and slurry combination is usually dictated by the required finish and flatness. Given these constraints, the polishing time needed to achieve the required finish and flatness sets the maximum throughput of the CMP apparatus.

A recurring problem in CMP is so-called Adishing@ in the substrate surface. Specifically, when the stop layer is exposed, the portion of the filler layer between the raised areas of the patterned stop layer can be overpolished, creating concave depressions in the substrate surface. Dishing can render the substrate unsuitable for integrated circuit fabrication, lowering process yield.

SUMMARY

In one aspect, the invention is directed to a method of chemical mechanical polishing a substrate having a filler layer disposed on a stop layer. In the method, the substrate is chemical mechanical polished with a single layer hard polishing pad and a first slurry until the stop layer is at least partially exposed. Then the substrate is chemical mechanical polished with a soft polishing pad and a second slurry which has a lower selectivity than the first slurry until the stop layer is substantially exposed.

Implementations of the invention may include one or more of the following features. A pressure equal or less than about 5 psi, e.g., less than 2.9 psi, may be applied to said substrate during polishing. The first slurry may have a selectivity greater than about 20:1, and the second slurry may have a selectivity less than about 6:1. The system may sense when the stop layer is at least partially exposed and when the stop layer is substantially exposed with an end-point detector. The single layer hard polishing pad may comprise polyurethane or abrasive particles embedded in a matrix. The filler layer may be a metal and the stop layer may be a dielectric material. Alternatively, the filler layer may be a first dielectric and the stop layer is a second dielectric material.

In another aspect, the invention is directed to a method of chemical mechanical polishing a substrate having a filler layer disposed on a stop layer. The substrate is chemical mechanical polished with a single layer hard polishing pad and a first slurry until the stop layer is at substantially entirely exposed. Then the substrate is chemical mechanical polished with a soft polishing pad and a second slurry which has a lower selectivity than the first slurry.

In yet another aspect, the invention is directed to a method of chemical mechanical polishing a substrate having an upper layer disposed over a lower layer. In the method, the substrate is chemical mechanical polished with a stacked polishing pad, the stacked polishing pad having at least a first layer disposed on top of a second layer, the first layer being harder than the second layer. Then the substrate is chemical mechanical polished with a single layer hard polishing pad. Then the substrate is chemical mechanical polished with a third polishing pad. The third polishing pad is softer than the single layer hard pad.

Implementations of the invention may include one or more of the following features. Polishing with the stacked polishing pad may stop when the lower layer is partially exposed. Polishing with the single layer hard polishing pad may stop when the lower layer is substantially entirely exposed. Alternatively, polishing with the stacked polishing pad may ends when the lower layer is substantially entirely exposed. Polishing with the stacked polishing pad may be performed with a first slurry, polishing with the single layer hard polishing pad may be performed with a second slurry, and the first slurry may have a higher selectivity than a second slurry. Polishing with the stacked polishing pad and the single layer polishing pad may be performed with a first slurry, polishing with the soft polishing pad may be performed with a second slurry, and the first slurry may have a higher selectivity than a second slurry. The single layer polishing pad may includes abrasive particles.

Potential advantages that may be seen in implementations of the invention may include zero or more of the following. Dishing in the substrate surface may be reduced or eliminated, thereby increasing process yield. Consistently low within wafer non-uniformity may be achieved. Erosion of the stop layer may be reduced. A thinner filler layer may be used, thereby decreasing the polishing time and increasing the throughput of the CMP apparatus. The substrate may be buffed for a longer period of time, thereby improving the substrate finish. All these approaches are also applicable to STI CMP in an IC production fab for different devices (0.25 lm and beyond) ranging from microprocessor to memory to analog devices having different pattern densities.

Other features and advantages will be apparent from the following description, including the drawings and claims.

DETAILED DESCRIPTION

Figure 1:
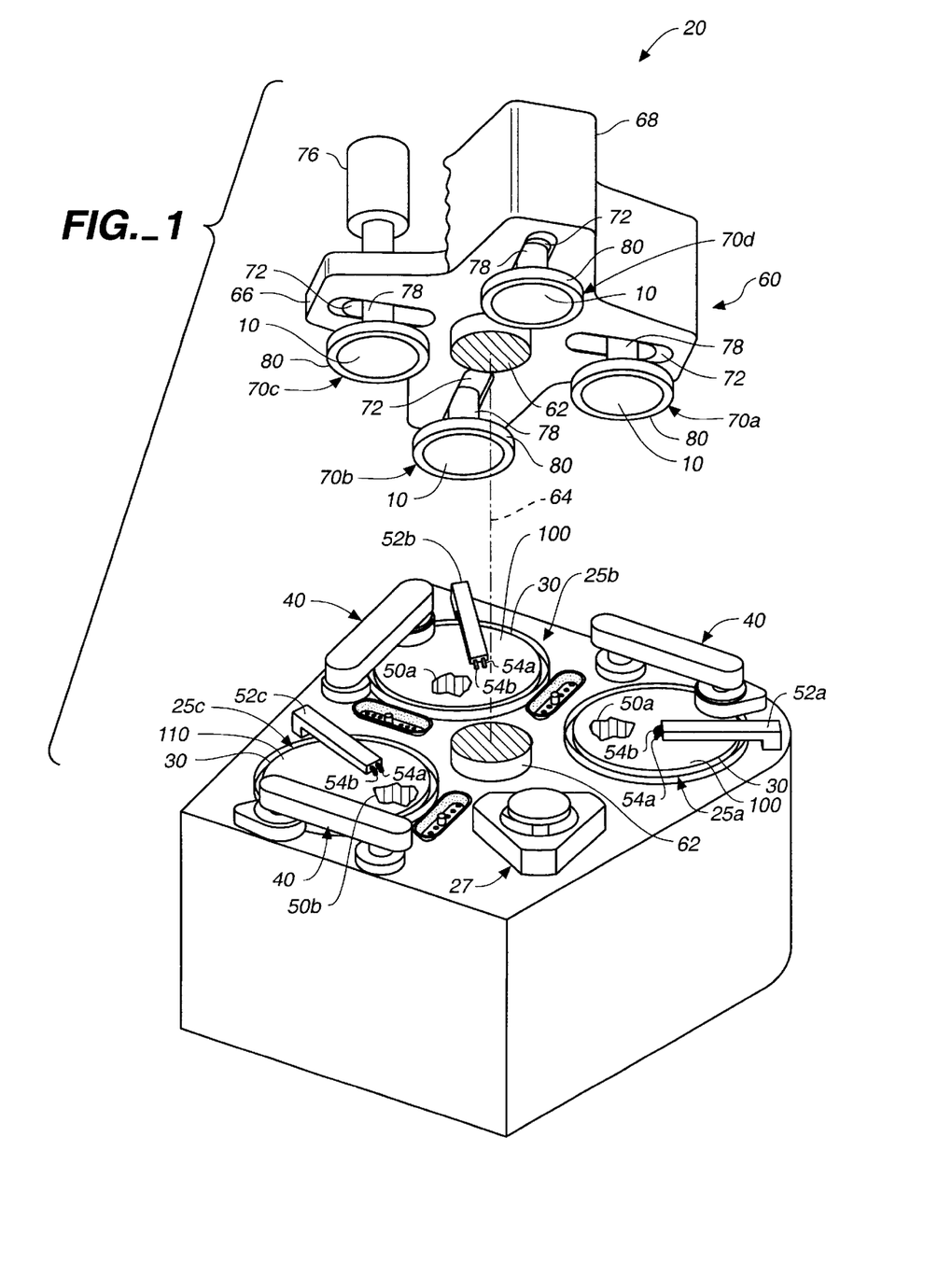
FIG. 1 is a schematic exploded perspective view of a chemical mechanical polishing apparatus.

Referring to FIG. 1, one or more substrates 10 will be polished by a chemical mechanical polishing (CMP) apparatus 20. A description of a similar polishing apparatus 20 may be found in U.S. Pat. No. 5,738,574, the entire disclosure of which is incorporated herein by reference. Polishing apparatus 20 includes a series of polishing stations, including a first polishing station 25a, a second polishing station 25b, and a final polishing station 25c, and a transfer station 27. Transfer station 27 serves multiple functions, including receiving individual substrates 10 from a loading apparatus (not shown), washing the substrates, loading the substrates into carrier heads, receiving the substrates from the carrier heads, washing the substrates again, and finally, transferring the substrates back to the loading apparatus.

Each polishing station includes a rotatable platen 30 on which is placed a polishing pad. The first and second stations 25a and 25b may include a relatively hard polishing pad 100, whereas the final polishing station may include a relative soft polishing pad 110. If substrate 10 is a Asix-inch@ (150 millimeter) or Aeight-inch@ (200 millimeter) diameter disk, then the platens and polishing pads may be about twenty inches in diameter. If substrate 10 is a Atwelve-inch@ (300 millimeter) diameter disk, then the platens and polishing pads may be about thirty inches in diameter. Each platen 30 may be a rotatable aluminum or stainless steel plate connected to a platen drive motor (not shown). For most polishing processes, the platen drive motor rotates platen 30 at thirty to two hundred revolutions per minute, although lower or higher rotational speeds may be used.

Each polishing station 25a, 25b and 25c also includes a combined slurry/rinse arm 52a, 52b and 52c, respectively, that projects over the associated polishing pad surface. Each slurry/rinse arm 52a–52c may include two or more slurry supply tubes 54a and 54b connected to a slurry delivery system to provide two or more slurries to the surface of the polishing pad. In operation, combined slurry/rinse arms 52a and 52b may supply a first polishing slurry 50a to polishing stations 25a and 25b, whereas combined slurry/rinse arm 52c may supply a second polishing slurry 50b to final polishing station 25c. Typically, sufficient slurry is provided to cover and wet the entire polishing pad. Each slurry/rinse arm 52a–52c also includes several spray nozzles (not shown) which provide a high-pressure rinse of the polishing pad at the end of each polishing and conditioning cycle. Each polishing station 25a–25c may further include an associated pad conditioner apparatus 40.

A rotatable multi-head carousel 60 is supported above the polishing stations by a center post 62 and is rotated thereon about a carousel axis 64 by a carousel motor assembly (not shown). Carousel 60 includes four carrier head systems 70a, 70b, 70c, and 70d mounted on a carousel support plate 66 at equal angular intervals about carousel axis 64. Three of the carrier head systems receive and hold substrates, and polish them by pressing them against the polishing pads on the platens of polishing stations 25a–25c. One of the carrier head systems receives a substrate from and delivers a substrate to transfer station 27.

Each carrier head system 70a–70d includes a carrier or carrier head 80. A carrier drive shaft 78 connects a carrier head rotation motor 76 (shown by the removal of one quarter of a carousel cover 68) to carrier head 80 so that each carrier head 80 can independently rotate about its own axis. In addition, each carrier head 80 independently laterally oscillates in a radial slot 72 formed in carousel support plate 66.

The carrier head 80 performs several functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

The carrier head 80 may include a flexible membrane (not shown) which provides a substrate receiving surface. A description of a suitable carrier head 80 may be found in U.S. pat. application Ser. No. 08/861,260, entitled A CARRIER HEAD WITH A FLEXIBLE MEMBRANE FOR A CHEMICAL MECHANICAL POLISHING SYSTEM, filed May 21, 1997, by Steven M. Zuniga et al., assigned to the assignee of the present invention, the entire disclosure of which is incorporated herein by reference.

Figure 2A:
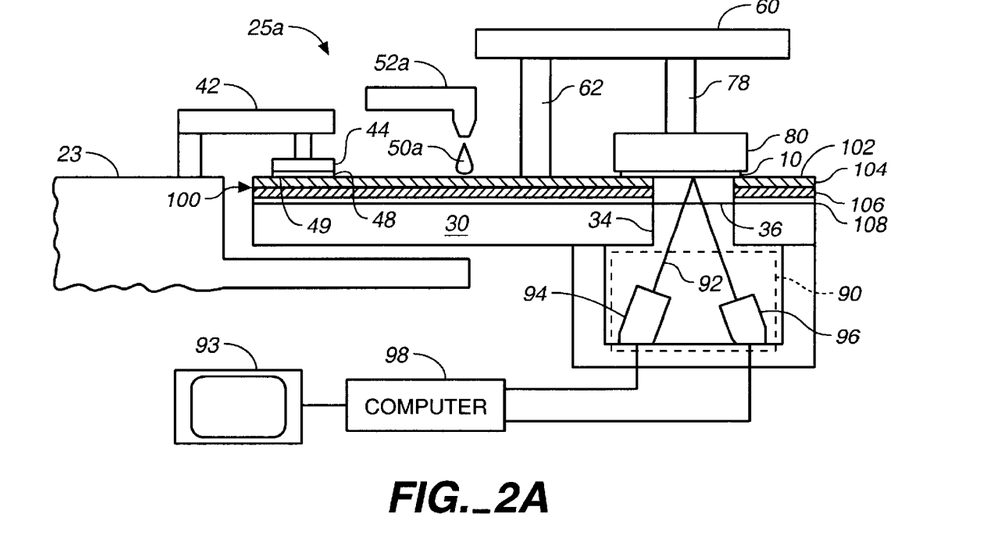
FIG. 2A is a schematic cross-sectional view of the first polishing station of the CMP apparatus of FIG. 1.

Referring to FIG. 2A, an aperture or hole 34 is formed in each platen 30 and a transparent window 36 is formed in a portion of polishing pad 100 overlying the hole. The transparent window 36 may be constructed as described in U.S. patent application Ser. No. 08/689,930, entitled METHOD OF FORMING A TRANSPARENT WINDOW IN A POLISHING PAD FOR A CHEMICAL MECHANICAL POLISHING APPARATUS by Manoocher Birang et al., filed Aug. 26, 1996, and assigned to the assignee of the present invention, the entire disclosure of which is incorporated herein by reference. The hole 34 and transparent window 36 are positioned such that they have a Aview@ of substrate 10 during a portion of the platen=s rotation, regardless of the translational position of the polishing head. A laser interferometer 90 is located below platen 30. The laser interferometer includes a laser 94 and a detector 96. The laser generates a collimated laser beam 92 which propagates through transparent window 36 to impinge upon the exposed surface of substrate 10.

In operation, CMP apparatus 20 uses laser interferometer 90 to determine an endpoint for a polishing step defined by the amount of material removed from the surface of the substrate, or to determine when the surface has become planarized. A general purpose programmable digital computer 98 may be connected to laser 94 and detector 96. Computer 98 may be programmed to activate the laser when the substrate overlies the window, to store measurements from the detector, to display the measurements on an output device 93, and to detect the polishing endpoint.

Still referring to FIG. 2A, at first polishing station 25a, the platen may support a polishing stacked pad 100 having a roughed surface 102, an upper layer 104 and a lower layer 106. Lower layer 106 may be attached to platen 30 by a pressure-sensitive adhesive layer 108. Upper layer 104 may be harder than lower layer 106. For example, upper layer 104 may be composed of microporous polyurethane or polyurethane mixed with a filler, whereas lower layer 106 may be composed of compressed felt fibers leached with urethane. A two-layer polishing pad, with the upper layer composed of IC-1000 or IC-1400 and the lower layer composed of SUBA-4, is available from Rodel, Inc. of Newark, Del. (IC-1000, IC-1400 and SUBA-4 are product names of Rodel, Inc.).

In another embodiment, polishing station 25b may include a polishing pad made of a single hard rigid layer.

Figure 2B:
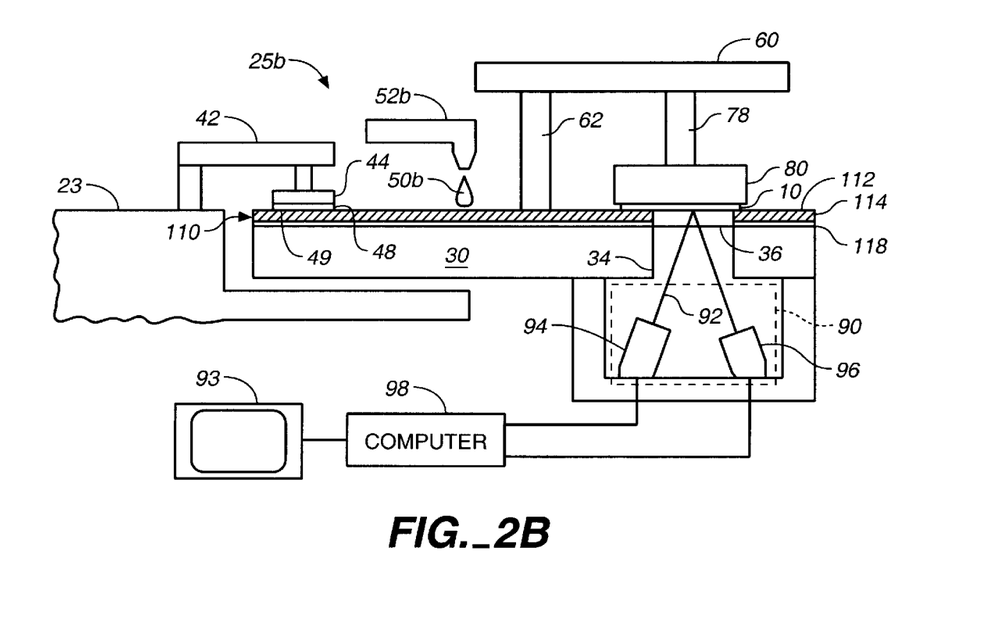
FIG. 2B is a schematic cross-sectional view of the second polishing station of the CMP apparatus of FIG. 1.

Referring to FIG. 2B, at second polishing station 25b, the platen may support a polishing pad 110 made of a single hard rigid layer 114 and including a roughed surface 112. Layer 114 may be attached to platen 30 by a pressure-sensitive adhesive layer 118. Layer 114 may be composed of a IC-1000 or IC-1400 available from Rodel, Inc. of Newark, Delaware. Alternatively, the polishing pad 110 may be a fixed abrasive pad with abrasive particles embedded in a resin matrix, available from 3M Company. Alternatively, the polishing pad 110 may be a two-layer pad with the upper layer significantly more rigid than the upper layer of the polishing pad at station 25a, or with a lower layer significantly thinner (e.g., more than 50%) than the lower layer of the polishing pad 100 at polishing station 25a. Polishing pad 110 may be embossed or stamped with a pattern to improve distribution of slurry across the face of the substrate. Polishing station 25b may otherwise be identical to polishing stations 25a.

In another embodiment, polishing station 25b may support a stacked two layer pad generally identical to the polishing pad 100 at the polishing station 25a.

Figure 2C:
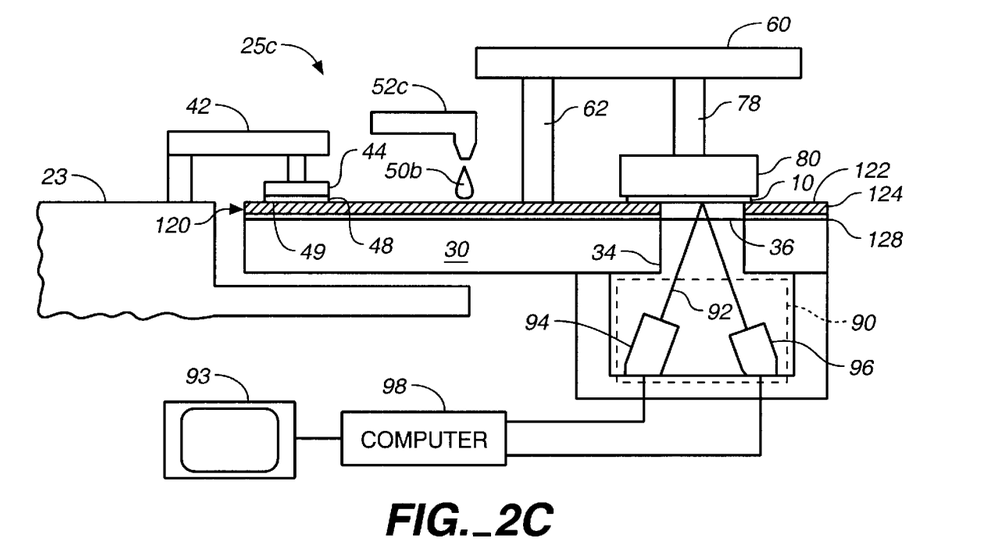
FIG. 2C is a schematic cross-sectional view of the final polishing station of the CMP apparatus of FIG. 1.

Referring to FIG. 2C, at final polishing station 25c, the platen may support a polishing pad 120 made of a single soft layer 124 and including a generally smooth surface 122. Layer 124 may be attached to platen 30 by a pressure-sensitive adhesive layer 128. Layer 124 may be composed of a napped poromeric synthetic material. A suitable soft polishing pad is available from Rodel, Inc., under the trade name Politex. Polishing pad 120 may be embossed or stamped with a pattern to improve distribution of slurry across the face of the substrate. Polishing station 25c may otherwise be identical to polishing stations 25a and 25b.

In another embodiment, polishing station 25c may support a stacked two layer pad similar to the polishing pad 100 at the first polishing station.

Figure 2D:
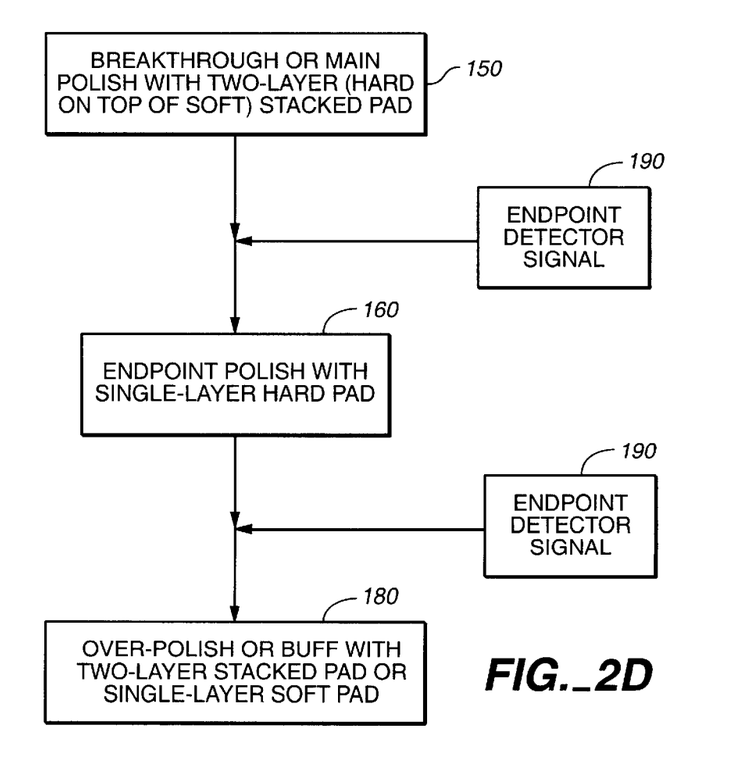
FIG. 2D is a flow diagram of a three step CMP polishing process.
Figure 2E:
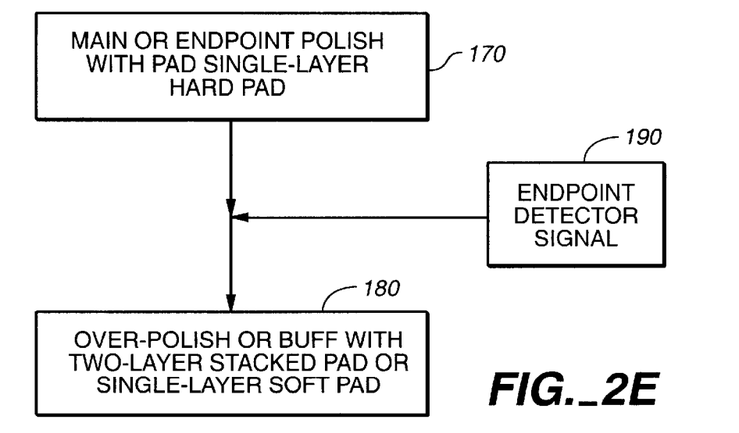
FIG. 2E is a flow diagram of a two step CMP polishing process.

FIGS. 2D and 2E are flow diagrams of three-step and two-step chemical mechanical polishing processes, respectively. In a three-step chemical mechanical process, the substrate is initially polished with a stacked two layer pad for breakthrough or main polishing 150. Then the substrate is polished with a single layer hard pad at low pressures e.g., less than 5 psi, for endpoint polishing 160. The endpoint polishing step 160 is followed by overpolishing or buffing 180 which may use either a single layer soft pad or a stacked two layer pad, as was described above. The first polishing step can stop when an underlying stop layer is partially exposed, whereas the second polishing step can stop when the underlying stop layer is entirely exposed. The breakthrough polishing step 150 can remove up to 75% of the material. The remaining material is removed at the endpoint polishing step 160. Each polishing step can be terminated when a stopping layer is reached 190 as detected with an endpoint detector, such as a laser interferometer 90, described above, or a vibration endpoint system.

A two-step chemical mechanical process includes polishing the substrate surface with a single layer hard polishing pad 170 until the stop layer is entirely exposed, and then overpolishing or buffing 180 the substrate with a single layer soft pad or a stacked pad.

Hard and large abrasive particles (e.g., irregularly-shaped $CeO_2$) may be used for faster removal rate and planarization rate at breakthrough or main polish step till endpoint. Soft and small abrasive particles (e.g., colloidal silica) may be used for better surface quality, lower defect counts and more controllable removal rate at breakthrough or main polish step and endpoint step. In certain embodiments, cooled slurries or pads and de-ionized water may be used for improved non-uniformity on all three platens.

Pads with deep, wide grooves (e.g., IC1010 available from Rodel, Inc. of Newark, Del.) may be used as the solo pad or the top pad of the stacked pad for improved defect reduction.

Figure 3A:
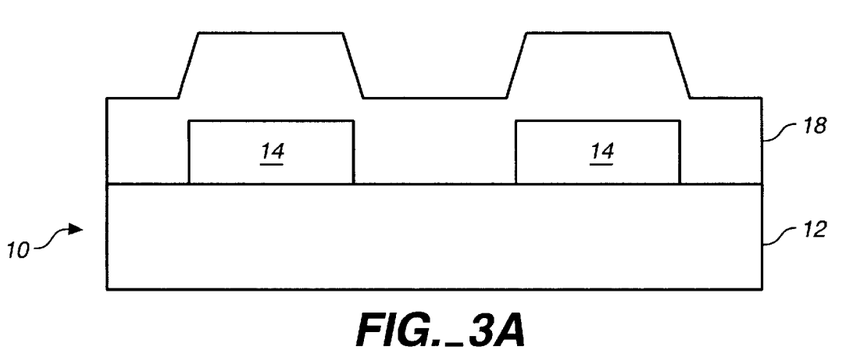
FIGS. 3A–3E are schematic cross-sectional views of a substrate illustrating the method of the present invention.

FIGS. 3A–3E illustrate the process of chemical-mechanically polishing a substrate having a filler and a stopping layer. As shown in FIG. 3A, substrate 10 includes a polishing stop layer 14 disposed over a silicon wafer 12. The polishing stop layer 14 is either patterned or disposed on a patterned underlying layer or layers so that it has a non-planar outer surface. A filler layer 18 is disposed over stop layer 16. The outer surface of filler layer 18 almost exactly replicates the underlying structures of stop layer 14, creating a series of peaks and valleys so that the exposed surface of the substrate is non-planar.

As discussed above, one purpose of planarization is to polish filler layer 18 until the top surface of stop layer 14 is entirely exposed. The resulting substrate surface is substantially planar, as the trenches and holes in the stop layer have been filled with the filler layer and the excess filler layer has been polished away. If the filler layer 18 is conductive and the stop layer 14 is insulative, then this polishing will leave conductive vias 16 between insulative islands 14, and conductive plugs in any holes in the insulative layer (see FIG. 3E).

As previously discussed, an effective CMP process not only provides a high and predictable polishing rate, but also provides a substrate surface with low within wafer non-uniformity (WIWNU), reduced defects and "dishing" and is predictable. The polishing rate and WIWNU are determined by the type of pad, force pressing the substrate against the pad, relative speed between the substrate and pad, slurry and combinations of these factors.

Without being limited to any particular theory, one possible cause of the dishing effect is the use of high selectivity slurries during overpolishing. Specifically, due to non-uniformities in the polishing process, the filler layer 18 may not be removed uniformly across the substrate 10. Consequently, it may be necessary to "overpolish" the substrate with a high-selectivity slurry to ensure that the upper surface of the stop layer 14 is exposed across the entire face of the substrate. Overpolishing with the high-selectivity slurry removes the excess filler layer and avoids nonuniform polishing of the stop layer, thereby improving global flatness. However, since the high-selectivity slurry polishes the filler layer but not the stop layer, this overpolishing tends to polish away a portion of the filler layer in the trenches or holes, thereby causing dishing.

Figure 3B:
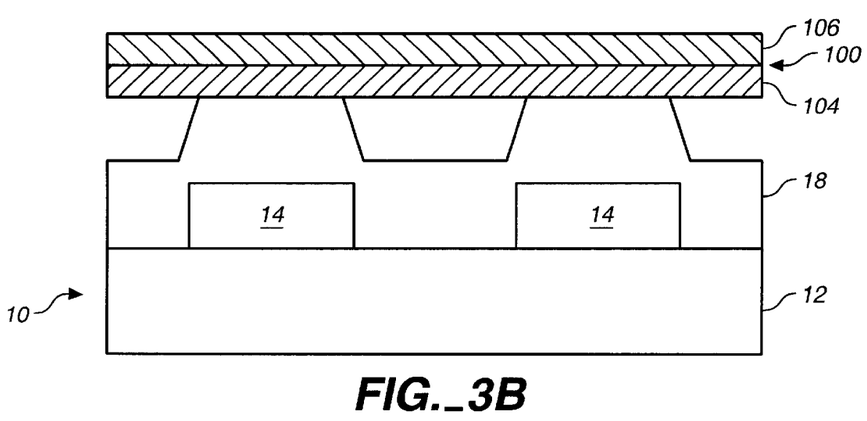
Figure 3C:
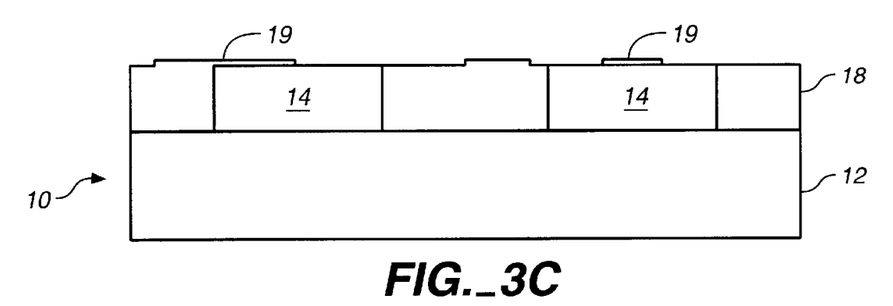

Referring to FIG. 3B, substrate 10 is initially polished at polishing stations 25a and 25b with a "high-selectivity" slurry and a hard polishing pad 110, or both a stacked polishing pad 100 and a hard polishing pad 110. The selectivity of the slurry refers to the ratio of the polishing rate of the filler layer to the polishing rate of the stop layer. The high-selectivity slurry may have a selectivity on the order of 20:1 to 300:1. Preferably, the high-selectivity slurry has a selectivity greater than about 20:1, e.g., a selectivity of approximately 100:1. The substrate is polished with the high-selectivity slurry until an endpoint detector, e.g., laser interferometer 90, detects that the stop layer 14 has been exposed. At this point, as shown in FIG. 3C, the stop layer should be at least partially exposed. Specifically, due to nonuniformities in the polishing rate across the substrate, a thin film 19 of the filler layer will probably remain over some portions of the stop layer, whereas other portions of the stop layer will be exposed.

Figure 3D:
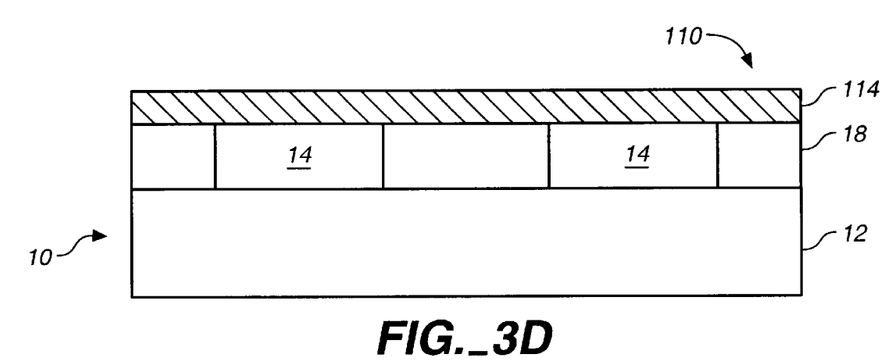
Figure 3E:
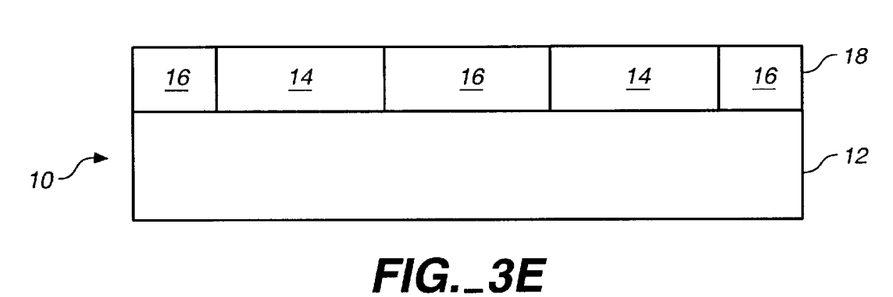

After the endpoint detector determines that the stop layer has been at least partially exposed, the substrate is subjected to an "overpolish" step to ensure that substantially all of the top surface of the stop layer is, in fact, exposed. About half of the stop layer may be exposed when the substrate is subjected to the overpolish step. Referring to FIG. 3D, for the overpolishing step the substrate is polished at the final polishing station 25c using a "non-selective" or "low-selectivity" polishing slurry on polishing pad 120. The low-selectivity slurry should have a selectivity on the order of 1:1 to 6:1. Preferably, the second slurry has a selectivity less than about 6:1, e.g., approximately 1:1. The substrate is polished with polishing pad 120 until stop layer 14 is substantially entirely exposed and thin film layer 19 has been substantially eliminated, as shown in FIG. 3E.

The use of a low-selectivity slurry in the overpolishing step ensures that both the filler layer and the stop layer are polished, thereby reducing or eliminating dishing. In addition, the majority of the filler layer is planarized quickly by use of the high-selectivity slurry and hard polishing pads, thereby providing high throughput and ensuring global planarity. Furthermore, since dishing is reduced, a thinner filler layer can be used, thereby decreasing the polishing time and increasing the throughput of the CMP apparatus.

Variations of the process are possible. For example, the substrate could be polished until stop layer 14 is exposed at polishing station 25a. The overpolishing step may be performed, e.g., at second polishing station 25b, with a hard polishing pad, rather than a soft polishing pad. Both the primary polishing step and the overpolishing step can be performed on at single polishing station, e.g., polishing station 25a. The overpolishing step may be followed by a buffing step with the low-selectivity slurry at the same polishing station (particularly if a soft polishing pad was used in overpolishing step) or at a different polishing station (particularly if a hard polishing pad was used in the overpolishing step).

Alternately, polishing with the high-selectivity slurry could continue after the endpoint is detected, e.g., at the second polishing station 25b, to provide overpolishing, and then the substrate could be buffed and/or subjected to an additional polishing step with the low-selectivity slurry, e.g., at polishing station 25c. In this case, the buffing or additional polishing step with the low-selectivity slurry polishes both the filler layer and the stop layer to reduce or eliminate dishing created in the overpolishing step.

The polishing process is usable with a variety of filler layers and stop layers, and can be adapted for a variety of fabrication steps that use CMP to planarize and expose a stop layer.

For example, the polishing process may be used in silicon polishing. In this case, the stop layer is typically an insulative oxide, such as silicon oxide, and the filler layer is a silicon layer, such as polycrystalline silicon (polysilicon), amorphous silicon or single crystal silicon. If silicon polishing is conducted, then an initial native oxide removal step may be performed, as discussed in U.S. application Ser. No. 09/097,004, entitled A TECHNIQUE FOR CHEMICAL MECHANICAL POLISHING SILICON, by Shijian Li et al., filed Jun. 13, 1998, assigned to the assignee of the present invention, the entire disclosure of which is incorporated herein by reference.

Assuming that the filler layer is polysilicon and the stop layer is silicon oxide, the high-selectivity slurry should be a polysilicon slurry, and the low-selectivity slurry should be an oxide polishing slurry. The polysilicon polishing slurry may include deionized water, fumed silica abrasive particles, and an amine-based chemically reactive agent which may also adjust the pH of the slurry. Suitable polysilicon polishing slurries include EPP-1000, EPP-1060, and EPP-1000LRP, available from Cabot Corp.; Planarlite-6101, Planarlite-6102 and Planarlite-6203, available from Fujimi, of Wilsonville, Ore., and SDE-3000 available from Rodel, Inc. The polysilicon polishing slurries mentioned above from Cabot, Fujimi and Rodel have selectivities of about 1:100 to 1:1000, depending on the composition of the insulative layer. The low-selectivity slurry may include deionized water, fumed silica abrasive particles, and a reactive agent pH adjuster, such as potassium hydroxide (KOH) or ammonium hydroxide. A suitable low-selectivity silicon/polysilicon polishing slurry is Advansil 2000, available from Rodel.

The polishing process may also be used for polishing of a conductive layer. In this case, the stop layer is typically an insulative layer 14, such as an oxide, e.g., silicon oxide, and the filler layer 18 is conductive layer, such as a metal, e.g., aluminum, copper or tungsten. For metal polishing, the high-selectivity slurry may be SSW-2000, available from Cabot, and the low-selectivity slurry may be SS-12, available from Cabot.

In addition, the polishing process may be used for shallow trench isolation (STI). In STI polishing, the stop layer 14 is a first dielectric material, such a nitride, e.g., silicon nitride, and the filler layer 18 is a second dielectric material, such as an oxide, e.g., silicon oxide. For STI polishing, the high-selectivity slurry may be Corundum, available from Rodel, whereas the low-selectivity slurry may be SS-12, also available from Rodel.

Figure 4:
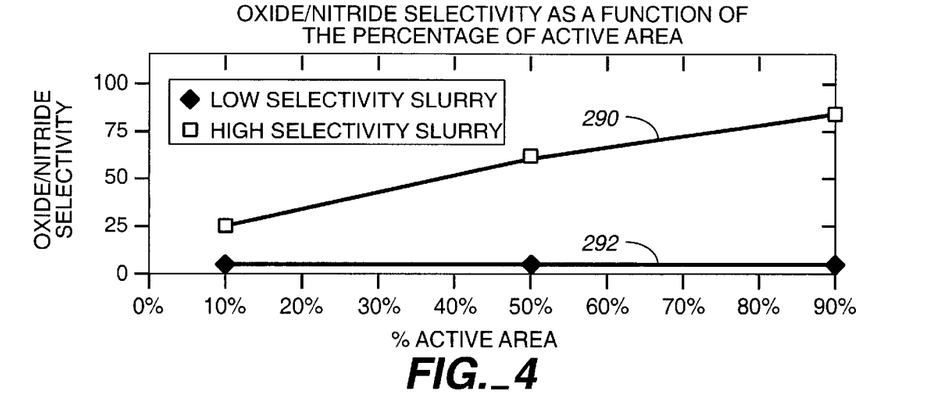
FIG. 4 is a graph depicting the oxide/nitride selectivity as a function of the percentage of active area for low and high selectivity slurries.

High selectivity slurry is used in STI CMP to minimize nitride stop layer erosion. The selectivity of a high selectivity slurry depends upon the active area pattern density. Referring to FIG. 4, the selectivity, i.e., the ratio of the polishing rate of the oxide filler layer to the polishing rate of the nitride stop layer is plotted as a function of the percent active area (pattern density) for a high selectivity slurry (curve 290) and for a low selectivity slurry (curve 292). For the case of the high selectivity slurry, the selectivity decreases from 85 at 90% active area pattern density to 25 at 10% active area pattern density. The low selectivity slurry does not exhibit this dependence upon the active area pattern density.

Figure 5A:
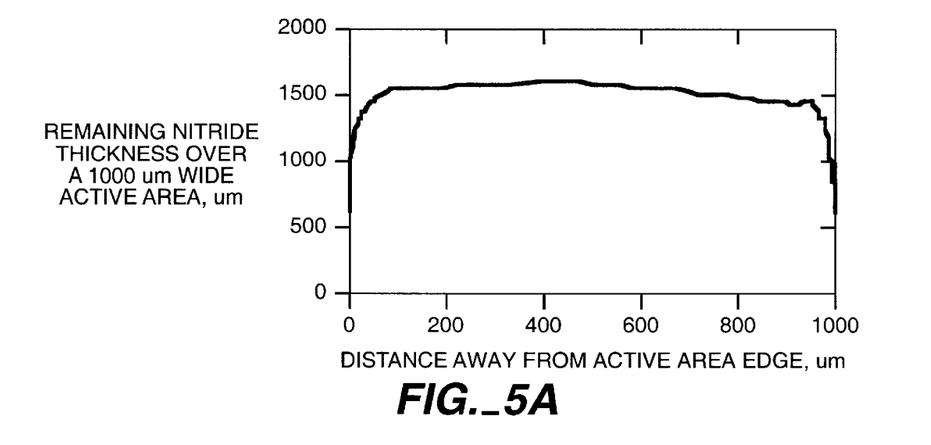
FIGS. 5A and 5B are graphs depicting nitride erosion and oxide dishing, respectively, in the 50% active/field area region of 1000 Îm feature size of equal line and equal space as a function of the distance away from the active/field area edge.
Figure 5B:
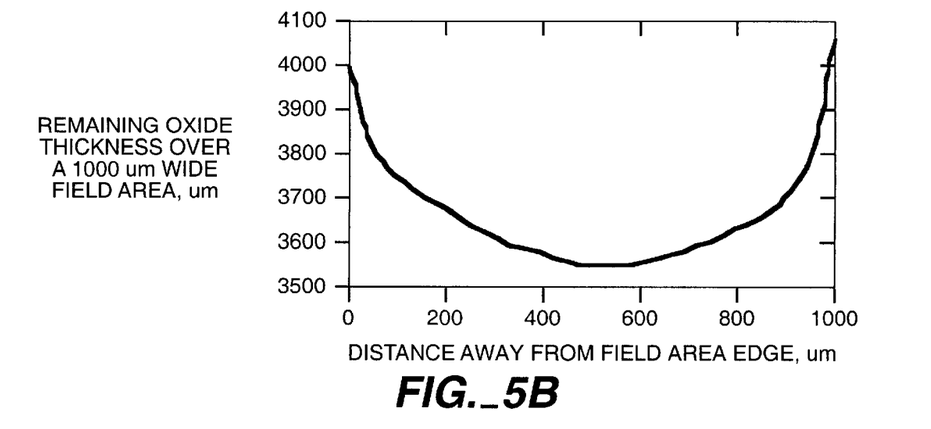

In addition, as shown in FIG. 5A which depicts the remaining nitride thickness over a 1000 micrometers wide active area as a function of the distance away from the active area edge, the nitride stop layer erosion pattern feature is rounded in the active areas where nitride has been exposed during overpolish. Overpolish time has to be extended to completely remove the oxide in the active areas if Within Wafer Non-uniformity (WIWNU) is poor. The extended overpolish time with a high selectivity slurry leads to more severe field oxide dishing, as shown in FIG. SB, where the remaining oxide thickness over a 1000 micrometer wide field area is plotted as a function of the distance away from the field area edge.

Figure 6A:
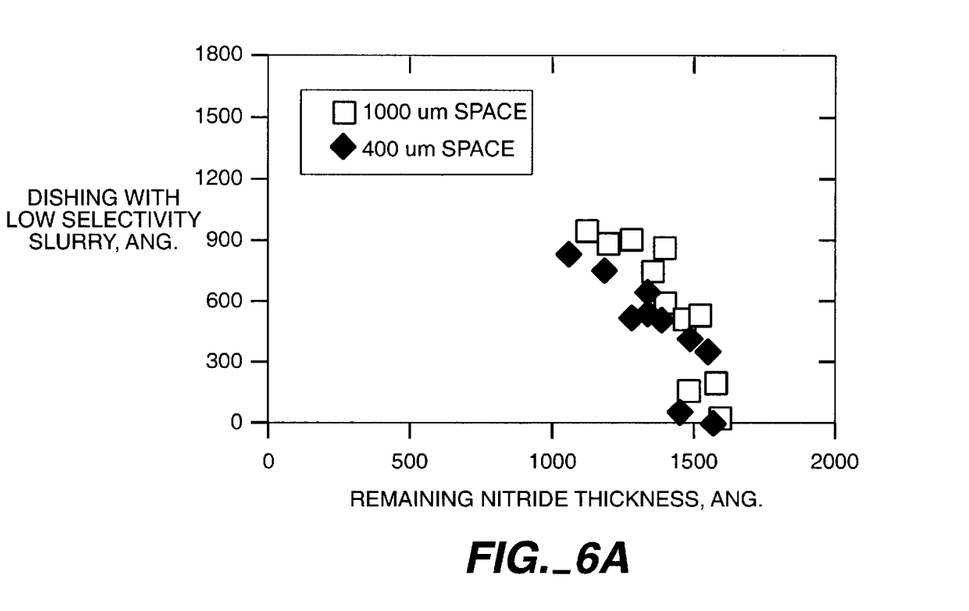
FIGS. 6A and 6B are graphs depicting dishing for low and high selectivity slurries, respectively, as a function of the remaining nitride thickness for 1000 Îm and 400 Îm space.
Figure 6B:
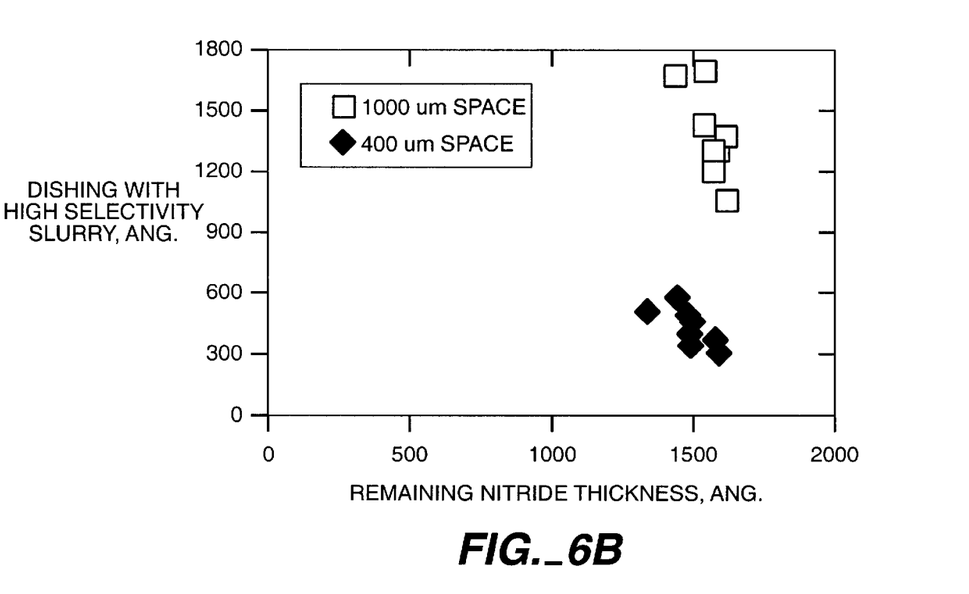

Referring to FIGS. 6A and 6B, dishing for a low selectivity slurry and a high selectivity slurry, respectively is plotted as a function of the remaining nitride thickness on a 1000 Ìm-wide space and a 400 Ìm-wide space. As shown, dishing is more pronounced when a high selectivity slurry is used as compared to a low selectivity slurry. In one example, after oxide removal in the active areas, dishing can be as deep as 1400 Å on 1000 Ìm-wide space when using a high selectivity slurry (FIG. 6B). In contrast, dishing can be less than 600 Å (corresponding to <200 Å nitride erosion) on 1000 Ìm-wide space when using a low selectivity slurry (FIG. 6A). Severe dishing and across wafer variation in dishing can lead to device failure. In the case when dishing causes the field oxide to recess below the silicon surface prior to polysilicon deposition, polysilicon wrapping around the silicon device corner will result in higher sub-threshold leakage current. Another potential device failure can be caused by polysilicon residues and/or stringers which reside in the active areas and at the foot of elevated field regions which are created by high WIWNU or by large across wafer variation in dishing.

Figure 7:
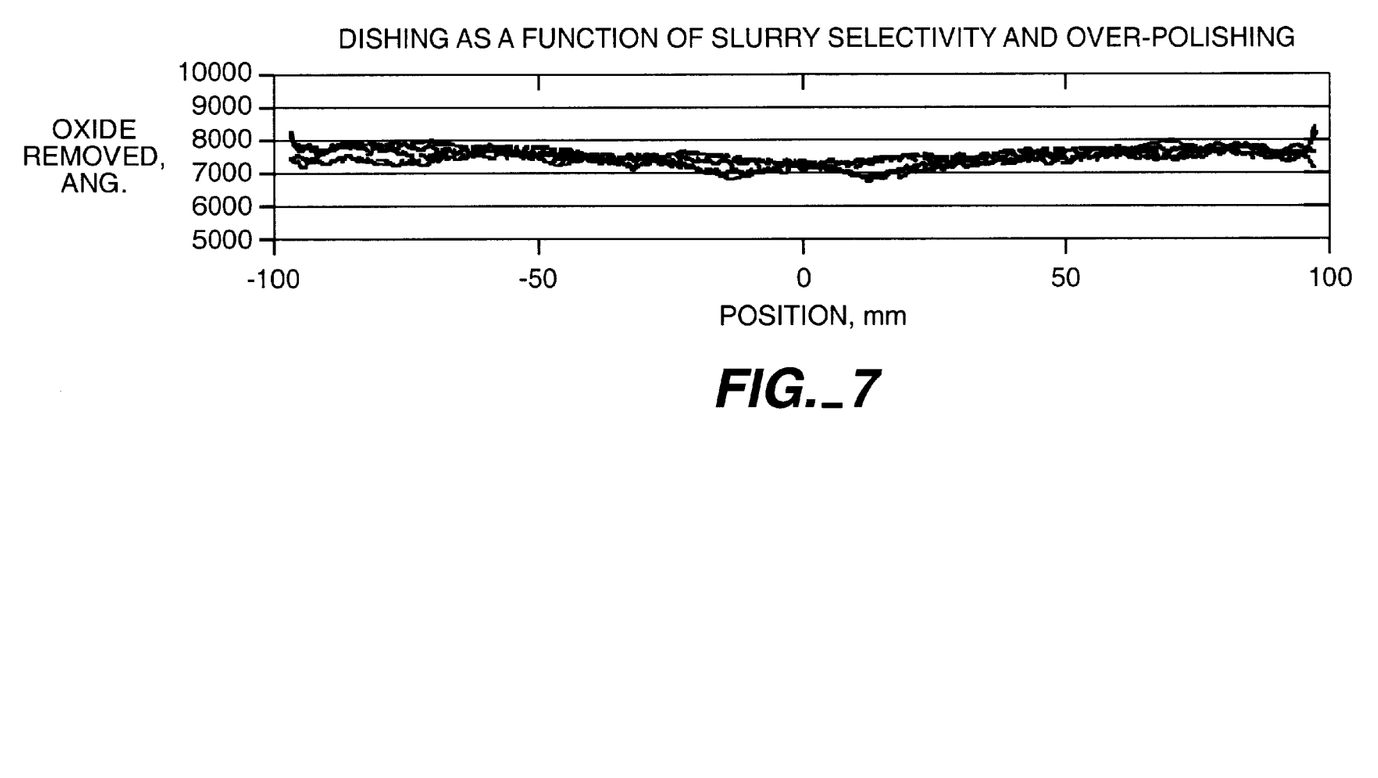
FIG. 7 is a graph depicting scans across 200 mm diameter wafers at 3 mm edge exclusion.
Figure 8:
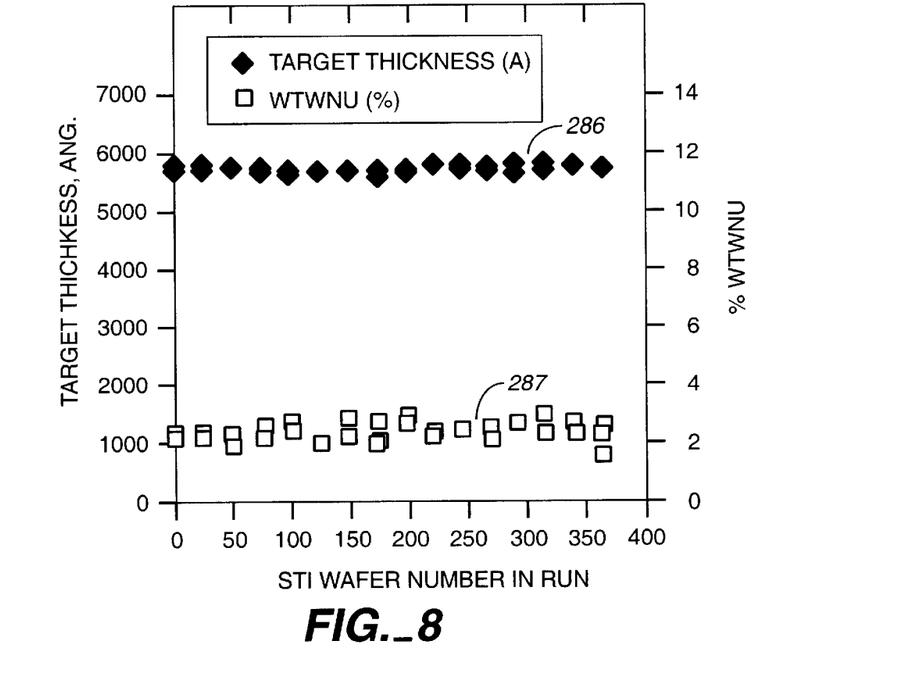
FIG. 8 is a graph depicting field oxide thickness and WIWNU as a function of wafer number in an extended run.

As previously discussed, low WIWNU in CMP is desirable. Three factors contribute to achieving a low WIWNU. The first factor is the use of a carrier head with a flexible membrane to apply uniform pressure on the wafer backside and a retaining ring with independent pressure control to adjust the removal rate at the edge of the wafer. The second factor is optimization of process/consumable parameters. Low membrane pressure (e.g. less than 5 psi) and low selectivity slurry (e.g., colloidal $SiO_2$ slurry) are used to achieve low WIWNU during trench oxide polishing, as shown in FIG. 7, which depicts wafer diameter scans across wafers having a diameter of 200 millimeters at 3 millimeter edge exclusion. The different curves represent different wafer and polishing head combinations. The third factor is to assure consistent endpoint detection on nitride by utilizing an endpoint detector. Endpoint detectors may be optical, e.g., laser interferometer, or vibration detection systems. The three aforementioned factors result in achieving WIWNU of less than 3% in a 360 wafer extended run, as shown in FIG. 8 curve 287. Additionally, the post-CMP field oxide thickness (curve 286 in FIG. 8) is consistent across the extended run. Pressure of 2.5/3/2.5 psi for membrane/retaining-ring/inner tube and speed of 63/57 rpm for platen/head are used to obtain the data of FIG. 8 with a stacked IC 1000/Suba IV polishing pad.

Figure 9:
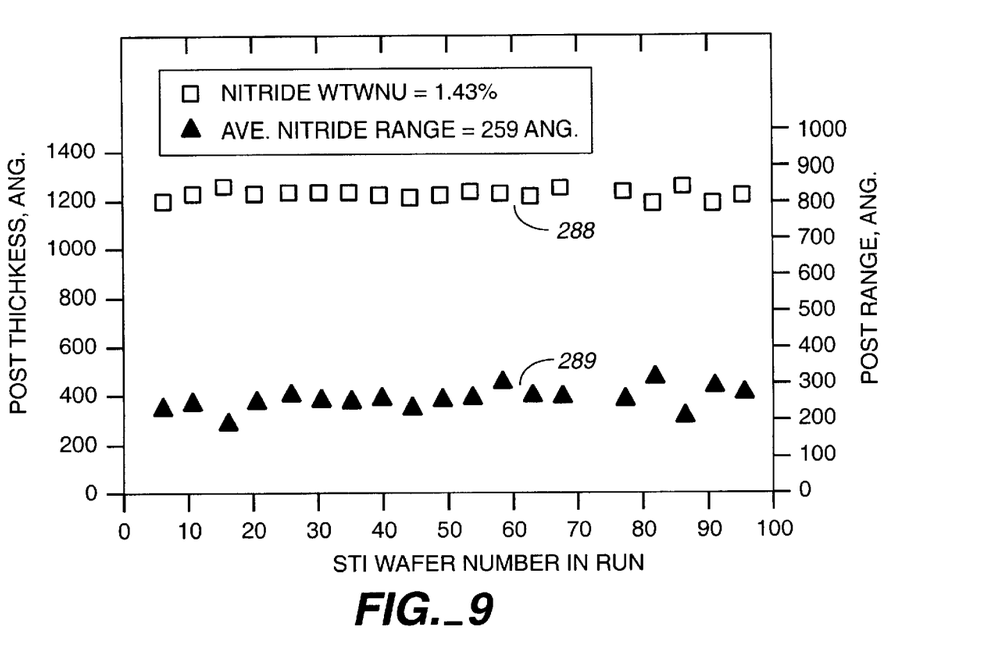
FIG. 9 is a graph depicting remaining nitride thickness and nitride thickness range as a function of wafer number in an extended run.

In FIG. 9 nitride erosion as manifested by post CMP nitride remaining thickness and nitride thickness range (max-min) is plotted as a function of wafer number in an extended run. Pressure of 4/4.6/4 psi for membrane/retainingring/inner tube and speed of 93/87/rpm for platen/head are used to obtain the data of FIG. 9 with a stacked IC 1000/Suba IV polishing pad. As shown in curve 288 nitride erosion is controlled to achieve nitride wafer-to-wafer non-uniformity (WTWNU) of 1.43% across a 100-wafer extended run. The remaining nitride thickness range (max-min) curve 289 is controlled to less than 350 Å with a 259 Å average over the characterized features.

Figure 10:
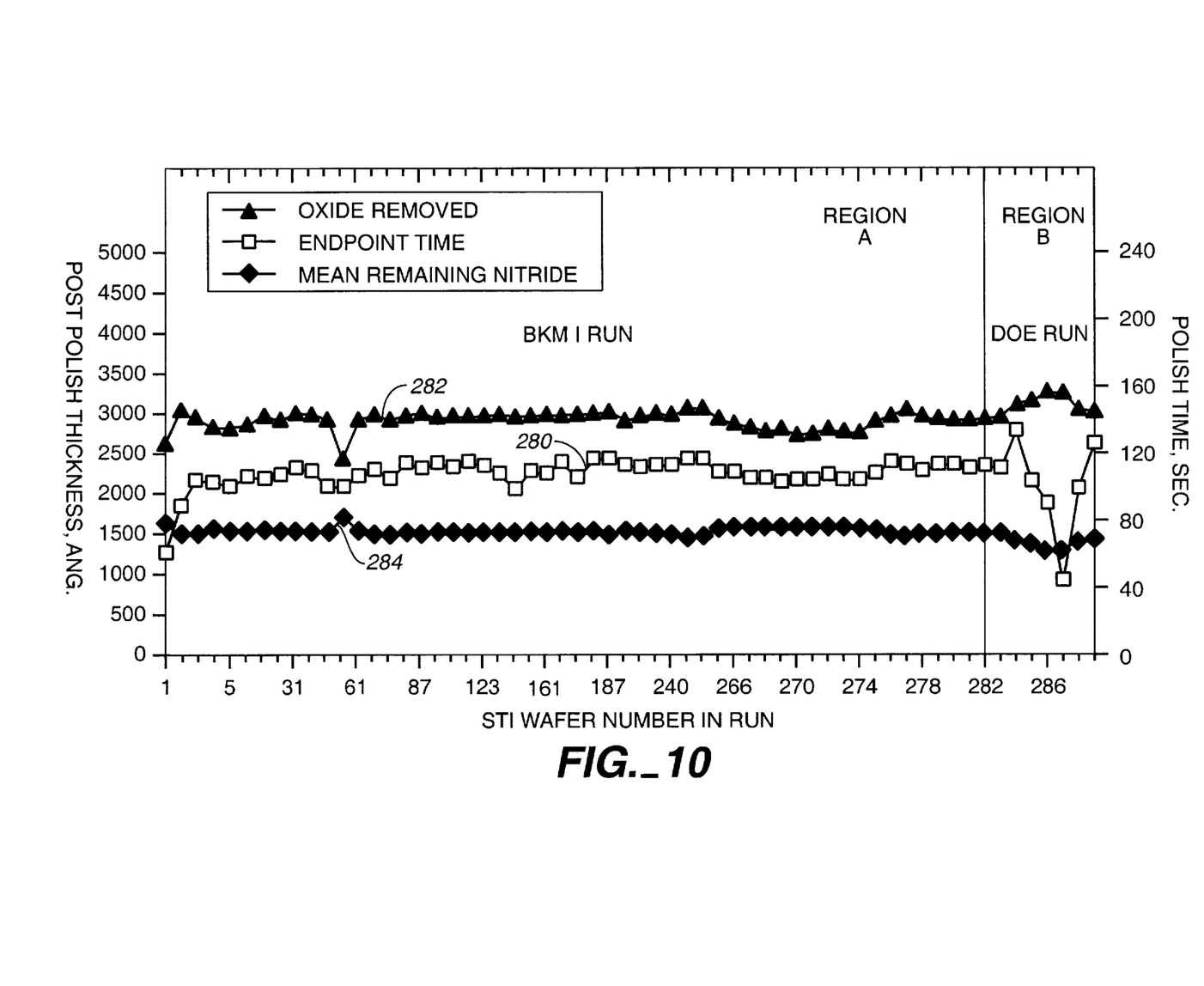
FIG. 10 is a graph depicting remaining nitride thickness, field oxide thickness, and actual polishing time at the end point as a function of wafer number in an extended run.

In FIG. 10 post CMP nitride (curve 284) and oxide thickness (curve 282) and actual polishing time at the end point (curve 280) are plotted as a function of wafer number in an extended run. Pressure of 4/4.6/4 psi for membrane/retaining-ring/inner tube and speed of 63/57 rpm for platen/head are used to obtain the data of FIG. 10 with a stacked IC 1000/Suba IV polishing pad. The first part of the data are taken during an optimized process run (Region A) and the second part of the data are taken during a design-of-experiment (DOE) run (Region B). Both post CMP nitride and oxide thickness are controlled during the optimized process run and the DOE run. The post-CMP remaining oxide thickness is the difference between the deposited oxide thickness and the thickness removed. During the DOE, the polishing rate is varied by changing pressure and platen/head rotation speed.

Figure 11A:
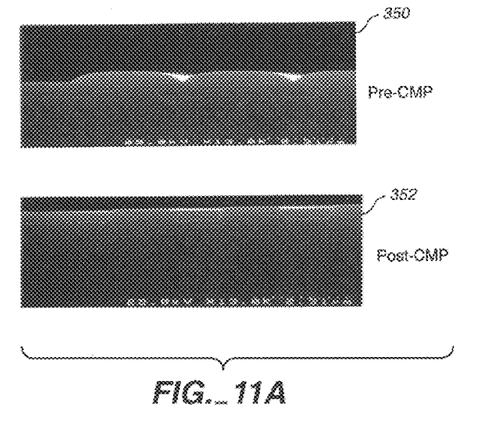
FIGS. 11A and 11B are Pre- and Post-CMP cross-section scanning electron microscopy (SEM) micro-graphs for SACVD oxide fill and HDPCVD oxide fill, respectively.
Figure 11B:
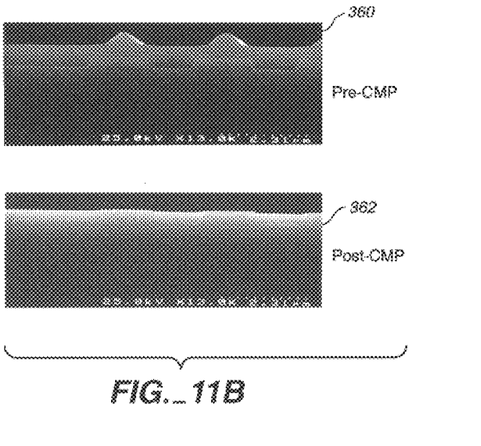

Referring to FIGS. 11A and 11B, pre-CMP 350, 360 and post-CMP 352, 362 scanning electron microscope (SEM) micro-graphs for SACVD and HDP CVD, respectively, are shown. The HDP CVD oxide fill shows a self-planarization effect due to sputtering during the deposition process. The self-planarization effect makes thinner trench oxide deposition practical and ultimately enables higher throughput on deposition tools. Nevertheless, oxide dishing and nitride erosion can be consistently controlled to a minimum for both SACVD and HDP CVD oxide trench fill.

The process can be used for different devices (0.25 Ìm and beyond) of different pattern densities, without relying on typical integration solutions such as dummy features, reverse mask etch, blanket nitride film, thin nitride sandwich film. Dummy features not only increase photo mask fabrication expense, but also have a potentially negative impact on the devices, especially when a polysilicon capacitor design is used. Other integration solutions increase manufacturing cost by introducing extra process steps. A STI CMP process without these integration expenses is very attractive to IC manufacturers.

As was discussed, wafer planarity depends upon the pressure, speed and pad type. The pressure parameter includes membrane, retaining ring and inner tube pressure. The speed parameter, includes platen and head speed. Two types of polishing pads are compared including an IC1000 hard solo pad and an IC1000/Suba IV stacked pad. Patterned wafers are prepared by depositing 16000 Å PETEOS film for filling 8200 Å deep trenches with different percentage of active area ranging from 10% to 90%. For the preparation of the wafer surface a mask layout is used, having 4×4 mm test structures with different percentage of active area ranging from 10% to 90% in each stepper field. For each experimental run, polishing time is controlled to remove 9000 +/−500 Å PETEOS in the 50% active area.

Figure 12:
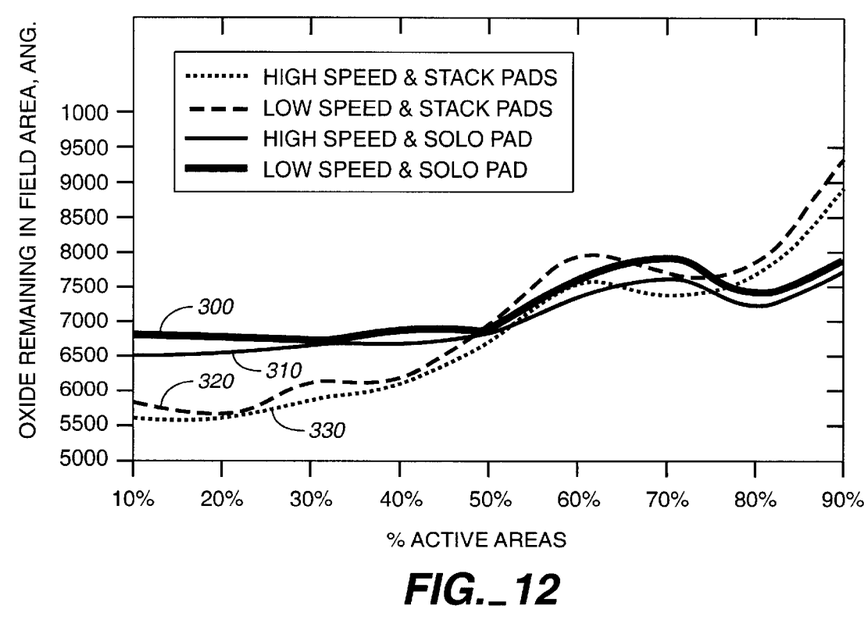
FIG. 12 is a graph depicting oxide remaining in the field area as a function of the percentage of active area after adjusted timed polishing. The different curves represent different polishing pad type and speed combinations.

Referring to FIG. 12, the thickness of the oxide remaining in the field area is plotted as a function of the percentage of active area after adjusted time polishing for a hard solo polishing pad (curves 300, 310) and for a stacked polishing pad (Curves 320, 330). The hard solo pad improves significantly the polishing uniformity of different substrate structures as compared to the hard/soft stacked pad at both high speed (platen/head 153/147 rpm) 310, 330 and low speed (platen/head 93/87 rpm) 300, 320. By using a hard solo pad at low pressure (2/2.9/2 psi for membrane/retaining-ring/inner tube) (Curve 300), the oxide thickness range (max-min) across die with different percentages of active area is controlled within 1200 Å. This is about ⅓ of the range observed on the same test mask under the similar conditions when the hard/soft stacked pads is used (Curve 320). The irregular shape of the curves in FIG. 12 might be attributed to the influence of neighboring features with a very different percentage of active area. Influence by neighboring features is governed by mask layout.

Figure 13:
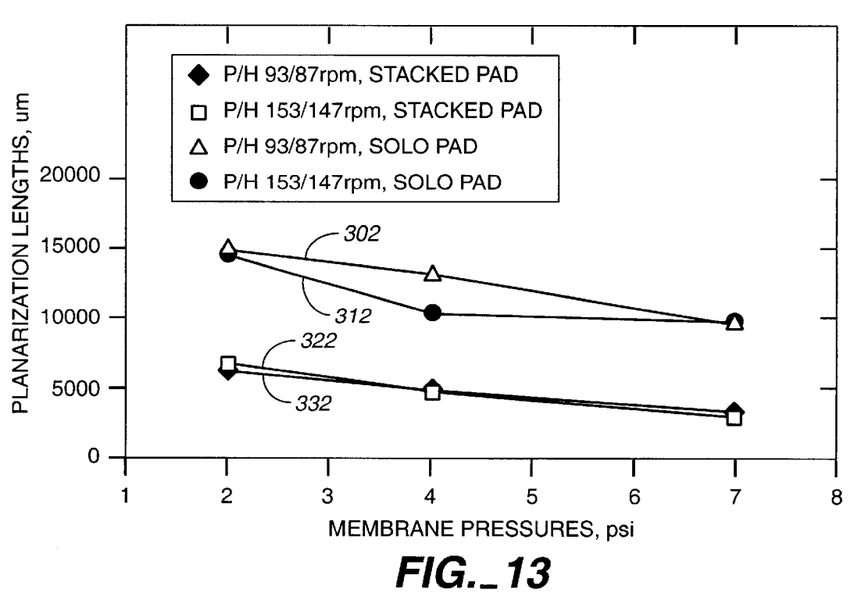
FIG. 13 is a graph depicting planarization length as a function of membrane pressure for different polishing pad type and speed combinations.

Referring to FIG. 13, the planarization length is plotted as a function of the membrane pressure for solo hard pads 302, 312 and stacked hard pads 322, 332. A planarization length of 15 millimeters is achieved with a solo hard pad whereas a planarization length of only 6 millimeters is achieved with a stacked pad. The membrane pressure is varied from 2 to 7 psi. Low membrane pressure improves the planarity as compared to high pressure in the tested range 2 to 7 psi. The results also indicate that planarity is insensitive to platen/head speed in the range of 93/87 rpm to 153/147 rpm on a 20" platen for both hard/soft stacked pads and a hard solo pad, curves 322, 332 and 302, 312, respectively.

Summarizing, wafer planarity is improved by polishing with a hard solo polishing pad under low membrane pressures. WIWNU of less than 5% at 5 mm edge exclusion and 3 mm edge exclusion is achieved on a 200 millimeter wafer after 182 sec polishing with a solo IC1000 hard pad at pressure 2/2.9/2 psi and speed 153/147 rpm. WIWNU of less than 7% is achieved on a wafer after 251 sec polishing with a solo IC1000 hard pad at pressure 2/2.9/2 psi and speed 93/87 rpm. Much lower WIWNU is expected when hard solo-pad polishing time is reduced to less than 60 sec.

Pad hardness is the dominant factor for achieving higher planarity. In the experimental ranges investigated, a rigid single layer pad with lower membrane pressure led to higher planarity. In addition, the planarity is insensitive to speed. The STI CMP process on the using a hard solo pad at low pressure showed planarity 50% better than that achieved on a linear polisher and three-fold better than that achieved when hard solo pad is not used.

The invention is not limited to the embodiment depicted and described. Rather, the scope of the invention is defined by the appended claims.

What is claimed is:

1. A method of chemical mechanical polishing a substrate having a filler layer disposed on a stop layer, comprising:
   chemical mechanical polishing the substrate with a single layer hard polishing pad and a first slurry until the stop layer is at least partially exposed; and
   chemical mechanical polishing the substrate with a soft polishing pad and a second slurry which has a lower selectivity than the first slurry until the stop layer is substantially exposed.

2. The method of claim 1 wherein a pressure equal or less than about 5 psi is applied to said substrate during polishing.

3. The method of claim 1, wherein the first slurry has a selectivity greater than about 20:1.

4. The method of claim 1, wherein the second slurry has a selectivity less than about 6:1.

5. The method of claim 1, further comprising sensing when the stop layer is at least partially exposed and when the stop layer is substantially exposed with an endpoint detector.

6. The method of claim 1, wherein said single layer hard polishing pad comprises polyurethane.

7. The method of claim 1, wherein said single layer hard polishing pad comprises abrasive particles embedded in a matrix.

8. A method of chemical mechanical polishing a substrate having a filler layer disposed on a stop layer, comprising:
   chemical mechanical polishing the substrate with a single layer hard polishing pad and a first slurry until the stop layer is at least partially exposed; and
   chemical mechanical polishing the substrate with a soft polishing pad and a second slurry which has a lower selectivity than the first slurry until the stop layer is substantially exposed, wherein a pressure equal or less than about 2.9 psi is applied to said substrate during polishing.

9. A method of chemical mechanical polishing a substrate having a filler layer disposed on a stop layer, comprising:
   chemical mechanical polishing the substrate with a single layer hard polishing pad and a first slurry until the stop layer is at least partially exposed; and
   chemical mechanical polishing the substrate with a soft polishing pad and a second slurry which has a lower selectivity than the first slurry until the stop layer is substantially exposed, wherein the filler layer is a metal and the stop layer is a dielectric material.

10. A method of chemical mechanical polishing a substrate having a filler layer disposed on a stop layer, comprising:
    chemical mechanical polishing the substrate with a single layer hard polishing pad and a first slurry until the stop layer is at least partially exposed; and
    chemical mechanical polishing the substrate with a soft polishing pad and a second slurry which has a lower selectivity than the first slurry until the stop layer is substantially exposed, wherein the filler layer is a first dielectric and the stop layer is a second dielectric material.

11. A method of chemical mechanical polishing a substrate having an upper layer disposed over a lower layer, comprising:
    chemical mechanical polishing the substrate with a stacked polishing pad, said stacked polishing pad having at least a first layer disposed on top of a second layer, said first layer being harder than the second layer;
    chemical mechanical polishing the substrate with a single layer hard polishing pad; and
    chemical mechanical polishing the substrate with a third polishing pad, said third polishing pad being softer than the single layer hard pad.

12. The method of claim 11, wherein polishing with the stacked polishing pad ends when the lower layer is partially exposed.

13. The method of claim 12, wherein polishing with the single layer hard polishing pad stops when the lower layer is substantially entirely exposed.

14. The method of claim 13, wherein polishing with the stacked polishing pad is performed with a first slurry, polishing with the single layer hard polishing pad is performed with a second slurry, and the first slurry has a higher selectivity than the second slurry.

15. The method of claim 13, wherein polishing with the stacked polishing pad and the single layer polishing pad is performed with a first slurry, polishing with the soft polishing pad is performed with a second slurry, and the first slurry has a higher selectivity than the second slurry.

16. The method of claim 11, wherein polishing with the stacked polishing pad ends when the lower layer is substantially entirely exposed.

17. The method of claim 16, wherein polishing with the stacked polishing pad is performed with a first slurry, polishing with the single layer hard polishing pad is performed with a second slurry, and the first slurry has a higher selectivity than the second slurry.

18. The method of claim 16, wherein polishing with the stacked polishing pad and the single layer polishing pad is performed with a first slurry, polishing with the soft polishing pad is performed with a second slurry, and the first slurry has a higher selectivity than the second slurry.

19. The method of claim 11, wherein said single layer polishing pad includes abrasive particles.

* * * * *